United States Patent [19]

Gwen et al.

[11] Patent Number: 5,472,892
[45] Date of Patent: Dec. 5, 1995

[54] METHOD OF MAKING A NON-VOLATILE FLOATING GATE MEMORY DEVICE WITH PERIPHERAL TRANSISTOR

[75] Inventors: Ki-Ho Gwen, Seoul; Kang-Deog Suh, Ahnyang-city; Jeong-Hyuk Choi, Kwacheon-city, all of Rep. of Korea

[73] Assignee: Samsung Electronics Co., Ltd., Suwon, Rep. of Korea

[21] Appl. No.: 101,239

[22] Filed: Aug. 2, 1993

[30] Foreign Application Priority Data

Jul. 31, 1992 [KR] Rep. of Korea ............... 13817/1992

[51] Int. Cl.$^6$ ............................................. H01L 21/8247
[52] U.S. Cl. .................... 437/43; 437/48; 257/316; 257/321
[58] Field of Search .................... 437/43, 48, 52; 257/315, 316, 324, 326, 321

[56] References Cited

U.S. PATENT DOCUMENTS 4,635,347  1/1987  Lien et al. .
4,766,088  8/1988  Kono et al. ...................... 437/52
4,810,666  3/1989  Taji ................................ 437/30
5,158,902  10/1992 Hanada ............................ 437/43
5,281,548  1/1994  Prall .............................. 437/43
5,304,503  4/1994  Yoon et al. ...................... 437/43

Primary Examiner—Olik Chaudhuri
Assistant Examiner—Richard A. Booth
Attorney, Agent, or Firm—Cushman Darby & Cushman

[57] ABSTRACT

The present invention discloses a non-volatile memory device having a multi-level gate structure. The storage cell transistor in the cell array region and the transistor in the peripheral circuit region have the same multi-level gate structure. Also, multi-level polycrystalline silicon layers in the peripheral circuit region are connected to each other, and thus utilized as an electrically singular gate electrode. The gate structures of the two regions are formed through a single etching process, so that the decreased processing number of photolithography simplifies overall process, and reduces the damage on the field oxide layer to thereby enhance an insulating performance.

7 Claims, 7 Drawing Sheets

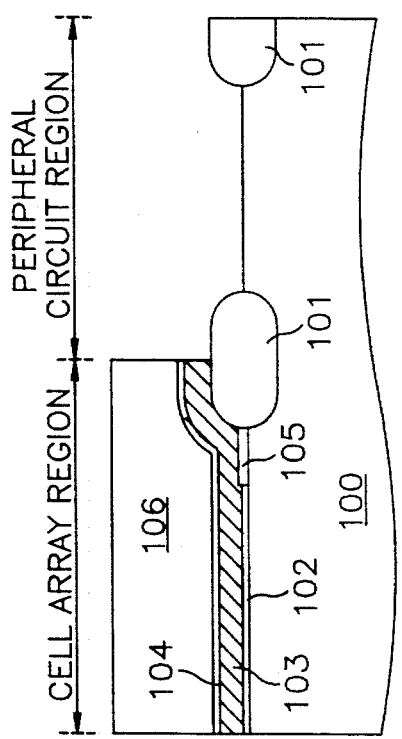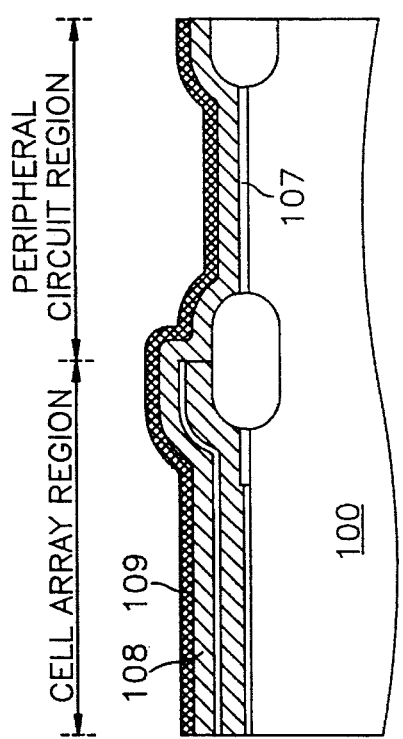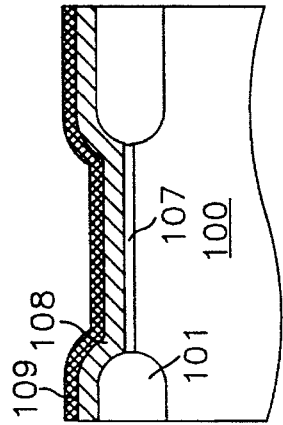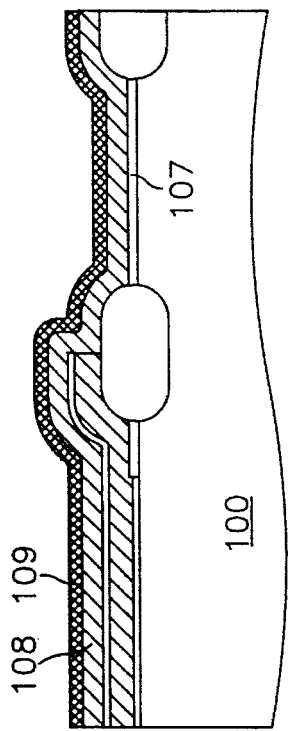
FIG. 1A (PRIOR ART)
FIG. 1B (PRIOR ART)
FIG. 1C (PRIOR ART)
FIG. 1D (PRIOR ART)

METHOD OF MAKING A NON-VOLATILE FLOATING GATE MEMORY DEVICE WITH PERIPHERAL TRANSISTOR

BACKGROUND OF THE INVENTION

The present invention relates to a semiconductor memory device, and more particularly to a non-volatile memory device having a multi-level gate structure.

General non-volatile memory devices include storage cell transistors having a multi-level gate structure in a cell array region, and associated transistors having a single-level gate structure for operating the storage cell transistors in a peripheral circuit region. An electrically erasable programmable read only memory (EEPROM) which can be erased and reprogrammed electrically is one type of the memory devices having a multi-level gate structure. A storage cell transistor of the EEPROM has a floating gate electrode for storing data, and a control gate electrode for controlling the floating gate electrode. In the storage cell transistor, an interlayer insulating film is provided between the control gate electrode and floating gate electrode, and a tunnel oxide layer is disposed between the floating gate electrode and a substrate.

A conventional technique for such an EEPROM is disclosed by R. Shirota, et al in IEDM, 1990, pp. 103–106, entitled: "A 2.3 mm$^2$ Memory Cell Structure for 16 Mb NAND EEPROMs".

FIGS. 1A to 1J show a process for manufacturing an EEPROM having a multi-level gate structure according to a known conventional technique. FIGS. 1A, 1C, 1E, 1G and 1I are longitudinally sectioned views showing a cell array region and peripheral circuit region of the EEPROM manufactured by a sequential process. FIGS. 1B, 1D, 1F, 1H and 1J are sectional views showing the peripheral circuit region laterally cut away from FIGS. 1A, 1C, 1E, 1G and 1I, respectively.

Referring to FIGS. 1A and 1B, a field oxide layer 101 is formed on a substrate 100 by a common LOCal Oxidation of Silicon (LOCOS). Then, a gate oxide layer 105 is formed on the whole surface of the substrate 100. The gate oxide layer 105 is etched by a photolithography to have a storage cell transistor in the cell array region thereon. Thereafter, a thin tunnel oxide layer 102 is formed on the surface of the substrate 100 in the portion where the storage cell transistor is formed. A first polycrystalline silicon layer 103 and an ONO (oxide/nitride/oxide) layer 104 which is an interlayer insulating film are sequentially formed thereon. Thereafter, using a photoresist pattern 106 as a mask, the layers on the peripheral circuit region only are sequentially etched by a conventional etching method, to thus expose the surfaces of the field oxide layer 101 and substrate 100. The first polycrystalline silicon layer 103 is a conductive layer for a floating gate electrode of the storage cell transistor.

Referring to FIGS. 1C and 1D, after removing the photoresist pattern 106, a gate oxide layer 107 is formed on the substrate 100 in the peripheral circuit region through a thermal oxidation, and a second polycrystalline silicon layer 108 and a tungsten silicide layer 109 are sequentially formed on the resultant surface. The second polycrystalline silicon layer 108 and tungsten silicide layer 109 form a control gate electrode of the storage cell transistor and a gate electrode of the transistor in the peripheral circuit region.

Referring to FIGS. 1E and 1F, a photoresist pattern 110 is formed on the peripheral circuit region to form the gate electrode of the transistor. The tungsten silicide layer 109 and second polycrystalline silicon layer 108 are etched to expose the surface of the field oxide layer 101 and the gate oxide layer 107. Thereafter, a ion-implantation is performed to form source and drain regions of the transistor in the peripheral circuit region as indicated in FIG. 1E.

Referring to FIGS. 1G and 1H, after removing the photoresist pattern 110, a photoresist pattern 111 is formed on the cell array region. The tungsten silicide layer 109, the second polycrystalline silicon layer 108, the ONO layer 104 and the first polycrystalline silicon layer 103 are then etched until the surface of the tunnel oxide layer 102 and the gate oxide layer 105 is exposed, thereby forming a storage cell transistor. Next, an ion-implantation is performed to form source and drain regions of the storage cell transistor.

Referring to FIGS. 1I and 1J, after removing the photoresist pattern 111, a drive-in is performed to form the source and drain regions of the transistor in the peripheral circuit region, and the source and drain regions of the storage cell transistor in the cell array region. An insulating layer of a low-temperature oxide (LTO) layer 112 and a borophosphorous silicate glass (BPSG) layer 113 are sequentially formed on the whole surface of the substrate 100, and a reflow process is performed. Finally, an opening is formed in the portions of the cell array region and the peripheral circuit region which will be contacted with metal layers 114 and 115 respectively, and then, the metal layers 114 and 115 are formed.

In a memory device having a multi-level gate structure manufactured by the conventional technique shown in FIGS. 1A to 1J, since the gate structure of the storage cell transistor 12 in the cell array region differs from that of the transistor 11 in the peripheral circuit region, additional photolithography processes are required as illustrated in FIGS. 1A, 1E and 1G. Due to this fact, the ONO layer 104 which is the interlayer insulating film is contaminated owing to an organic photoresist. Moreover, the damage on the field oxide layer resulting from numerous etching processes degrades insulating performance, and complicates the manufacturing process.

SUMMARY OF THE INVENTION

Accordingly, it is an object of the present invention to provide a non-volatile memory device, wherein a storage cell transistor and a transistor in a peripheral circuit region have a gate structure having the height even though only one of these transistors uses the multigate structure.

It is another object of the present invention to provide a method for manufacturing a non-volatile memory device having a multi-level gate electrode structure formed by a single photolithography process in which gate electrodes of storage cell transistors and transistors in a peripheral circuit region have the same height even though only one of these transistors uses the multigate structure.

It is still another object of the present invention to provide a method for manufacturing a non-volatile memory device having a multi-level gate structure, wherein an interlayer insulating film is protected from contamination, thereby providing improved interlayer insulating performance.

According to one feature of the present invention, the gate electrode of the transistor in the peripheral circuit region has a multi-level structure similar to the associated gate electrode of the storage cell transistor in the cell array region. The multi-level gate electrodes of the transistor in the peripheral circuit region are electrically connected to each other, thereby effectively functioning as a single gate electrode.

According to another feature of the present invention, the gate electrode of the transistor in the peripheral circuit region has a multi-level structure similar to the gate electrode of the storage cell transistor in the cell array region. Because the multi-level gate electrodes of the transistors in the peripheral circuit region are also connected to each other, so that the storage cell transistor and transistor in the peripheral circuit region can be advantageously formed by a single photolithography process.

According to still another feature of the present invention, a polycrystalline silicon layer for protecting the interlayer insulating film from contamination is provided.

BRIEF DESCRIPTION OF THE DRAWINGS

The above objects and other advantages of the present invention will become more apparent by describing in detail a preferred embodiment thereof with reference to the attached drawings in which:

FIGS. 1A to 1J show a process for manufacturing a non-volatile memory device by a conventional technique;

DETAILED DESCRIPTION OF THE PREFERRED EMBODIMENT

Figure 1F:
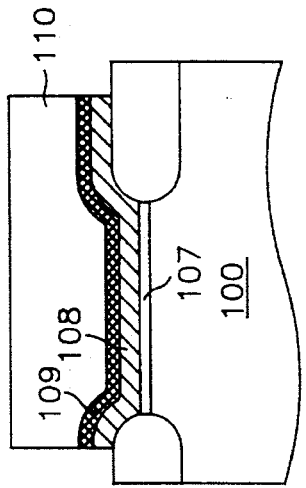
Figure 1H:
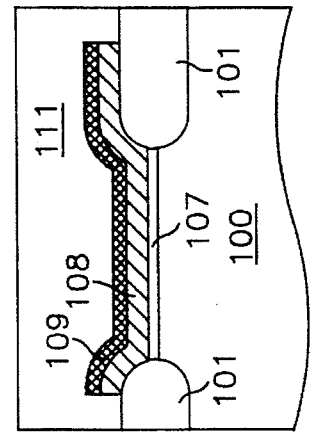
Figure 1E:
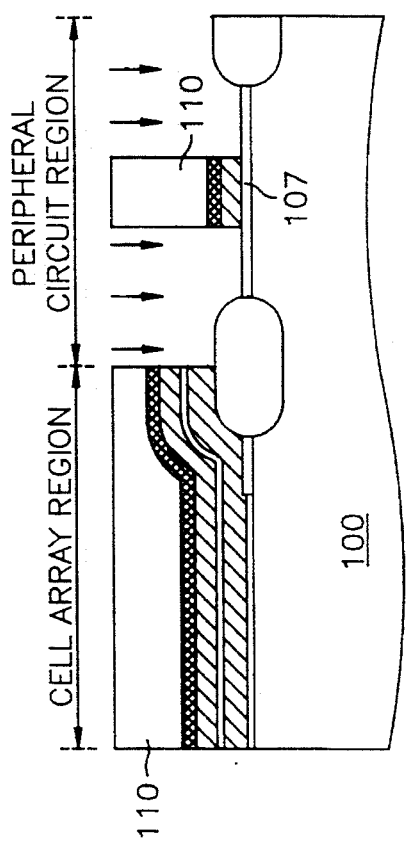
Figure 1G:
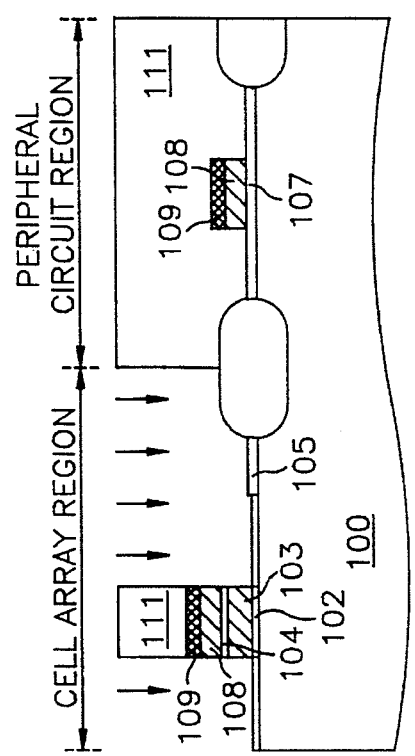
Figure 1J:
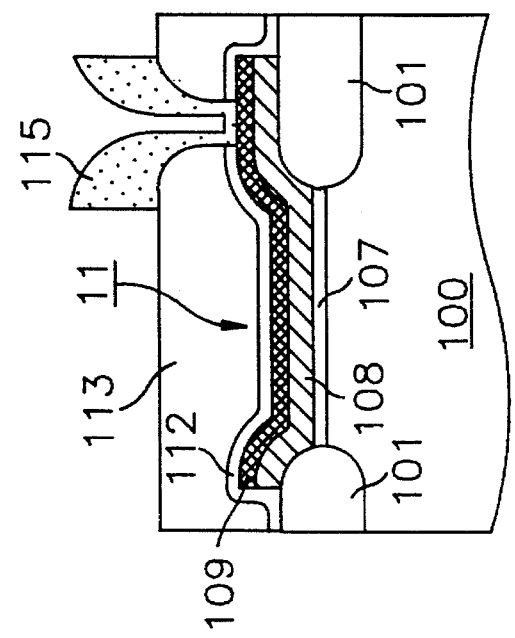
Figure 1I:
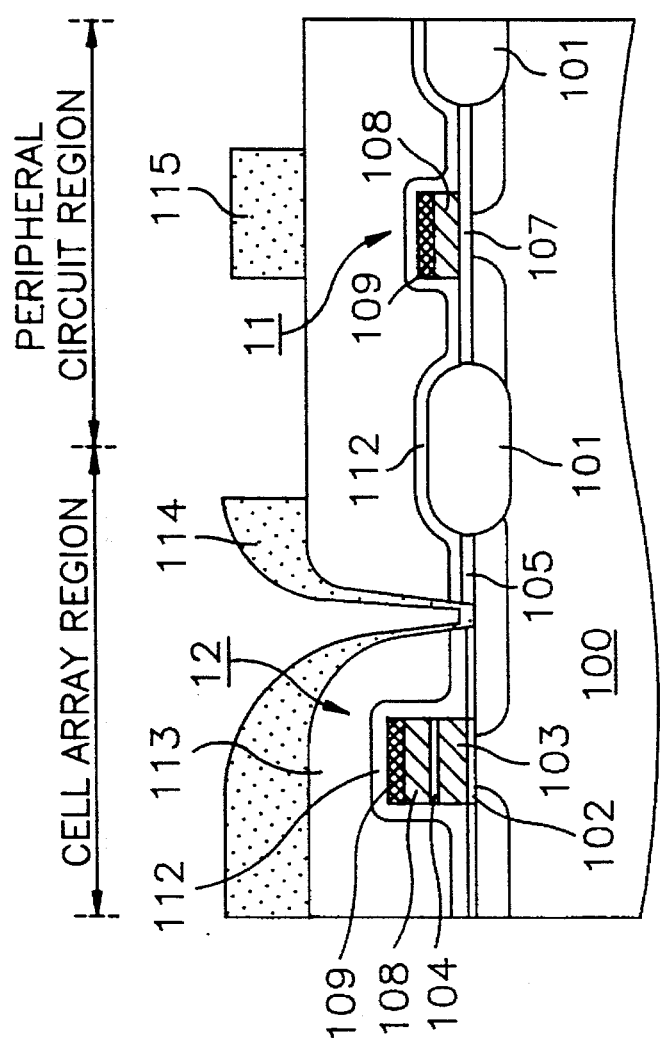
Figure 2:
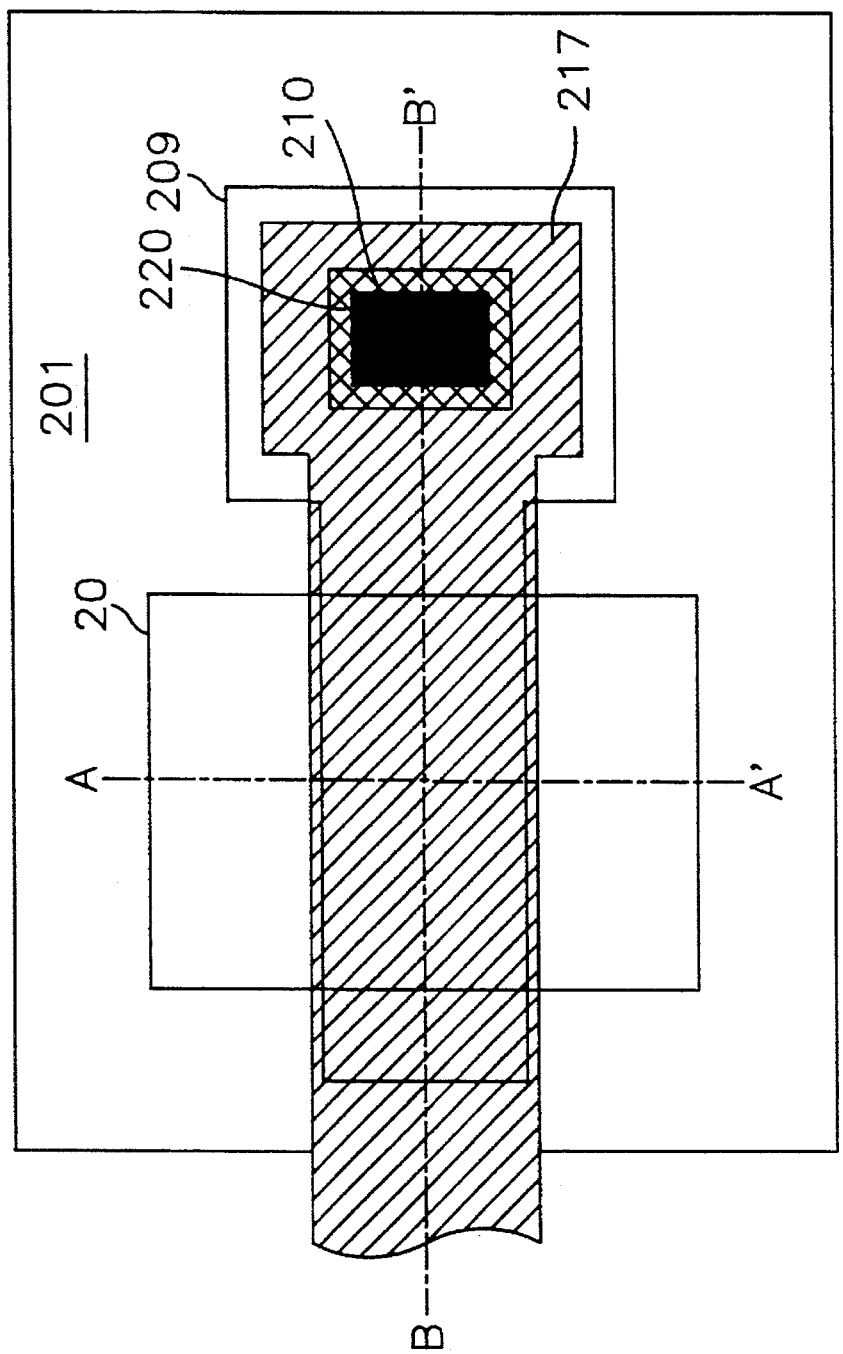
FIG. 2 shows a top layout view of the peripheral circuit region of a non-volatile memory device according to the present invention.

FIG. 2 is a layout view of the peripheral circuit region of a non-volatile memory device according to the present invention, wherein line A–A' is a section line for illustrating source and drain regions 20 of a peripheral circuit region, and a line B–B' is a section line for illustrating the shape of a contact hole between first and third polycrystalline silicon layers and a contact hole between the third polycrystalline silicon layer and a metal layer. A reference numeral 201 designates a field oxide layer; 20 is an active region having source and drain regions thereon; 210 is a contact hole pattern between the first and third polycrystalline silicon layers; 220 is a contact hole pattern between the third polycrystalline silicon layer and the metal layer; 209 is a silicide layer pattern which is an upper layer of a multi-level conduction layer stacked sequentially; and 217 is a metal layer pattern in contact with the third polycrystalline silicon layer via the contact hole 220.

FIGS. 3A to 3J show a process for manufacturing one embodiment of an EEPROM according to the present invention. FIGS. 3A, 3C, 3E, 3G and 3I are longitudinally sectioned views showing a cell array region and peripheral circuit region of the EEPROM manufactured by a sequential process, taken along the line A–A' of FIG. 2. FIGS. 3B, 3D, 3F, 3H and 3J are sectional views showing the peripheral circuit region laterally cut away from FIGS. 3A, 3C, 3E, 3G and 3I respectively, taken along the line B–B' of FIG. 2.

Figure 3B:
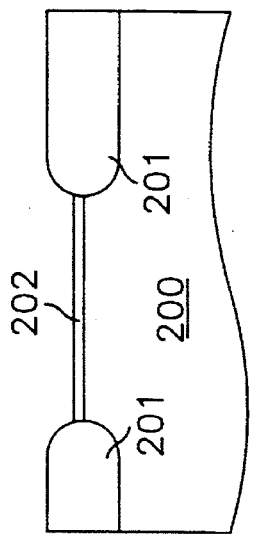
FIGS. 3A to 3J illustrate one embodiment of a process for manufacturing a non-volatile memory device according to the present invention.
Figure 3A:
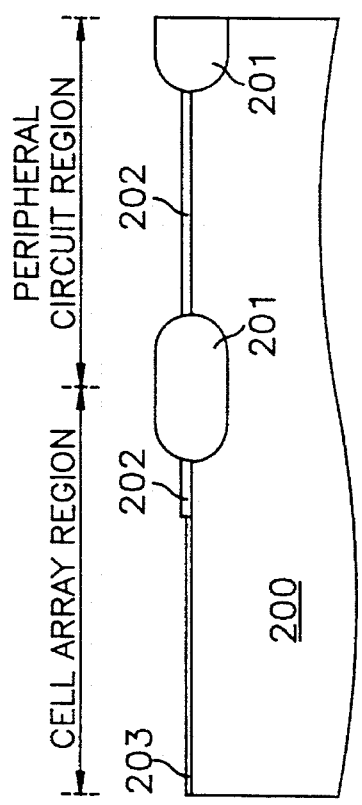

Referring to FIGS. 3A and 3B, a field oxide layer 201 is formed on a semiconductor substrate 200 by a common LOCOS, and a gate oxide layer 202 is formed on the surface of the substrate 200. The gate oxide layer is preferably about 200 Å to 300 Å thick. Then, the gate oxide layer 202 is etched by photolithography to expose a portion of the substrate 200. A tunnel oxide layer 203 is then formed on the exposed surface of the substrate 200 (i.e., a cell array region). Generally, the tunnel oxide layer 203 has a thickness of less than 200 Å.

Figure 3D:
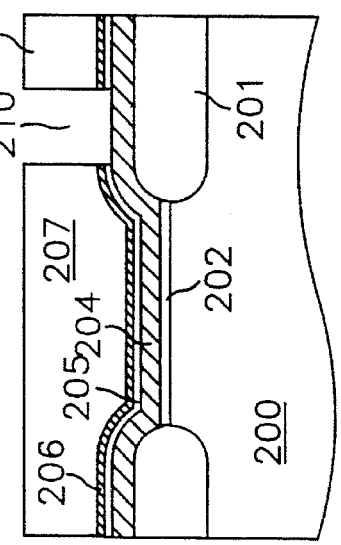
Figure 3C:
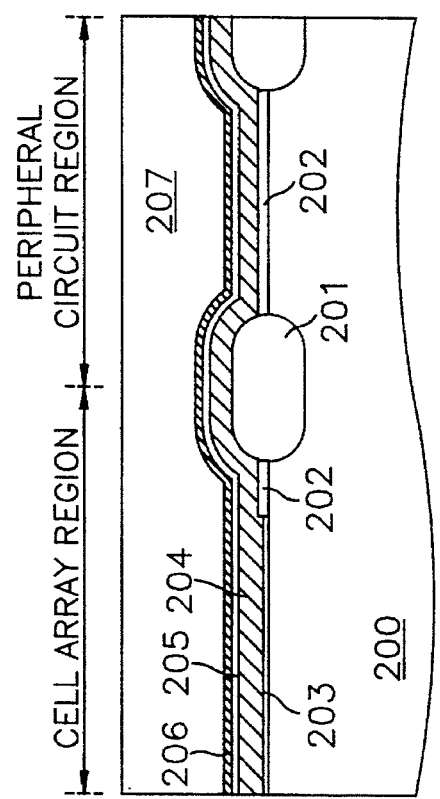

In FIGS. 3C and 3D, a first polycrystalline silicon layer 204, an ONO layer 205 of an interlayer insulating film, and a second polycrystalline silicon layer 206 are sequentially formed on the resultant surface structure of the substrate 200. The second polycrystalline silicon layer 206 and the interlayer insulating film 205 in the peripheral circuit region are partially etched by photolithography to expose a portion of the surface of the first polycrystalline silicon layer 204, thereby forming a contact hole 210 (see in FIG. 3D). Preferably, the second polycrystalline silicon layer 206 has a thickness of about 200 to 500 Å, and functions to prevent the interlayer insulating film 205 from being contaminated by photoresist pattern 207, which is typically composed of an organic material. In this embodiment, an ONO layer 205 is utilized as the interlayer insulating film, but an oxide layer or another insulating layer may be used instead.

Figure 3F:
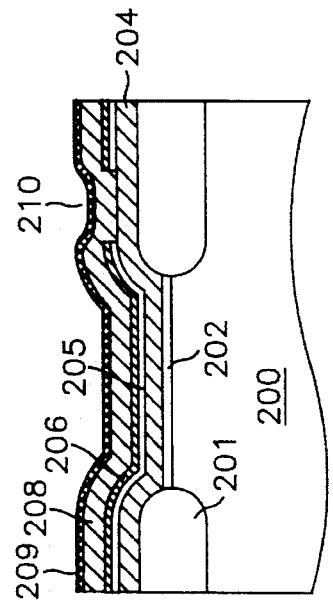
Figure 3H:
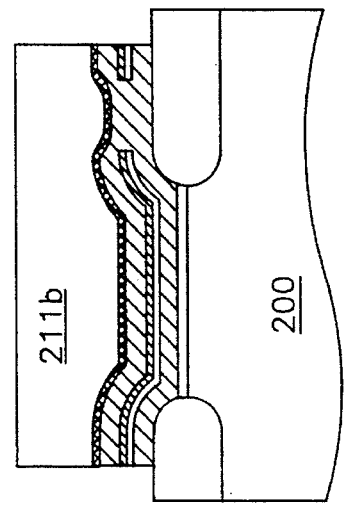
Figure 3E:
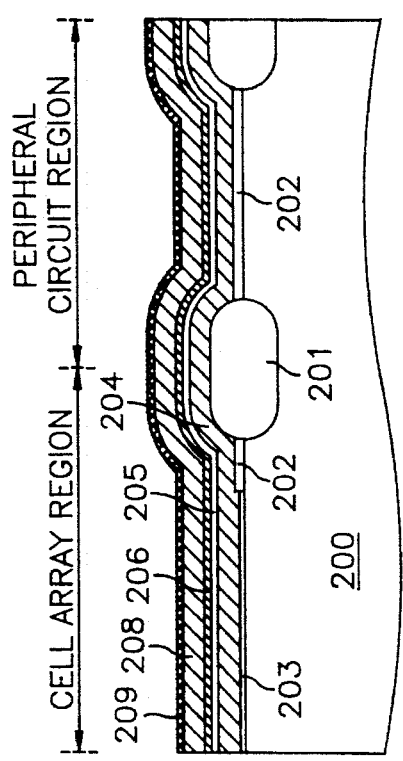

Referring to FIGS. 3E and 3F, the photoresist pattern 207 is removed, and a third polycrystalline silicon layer 208 and a silicide layer 209 are sequentially formed on the surface of the resultant structure.

Figure 3G:
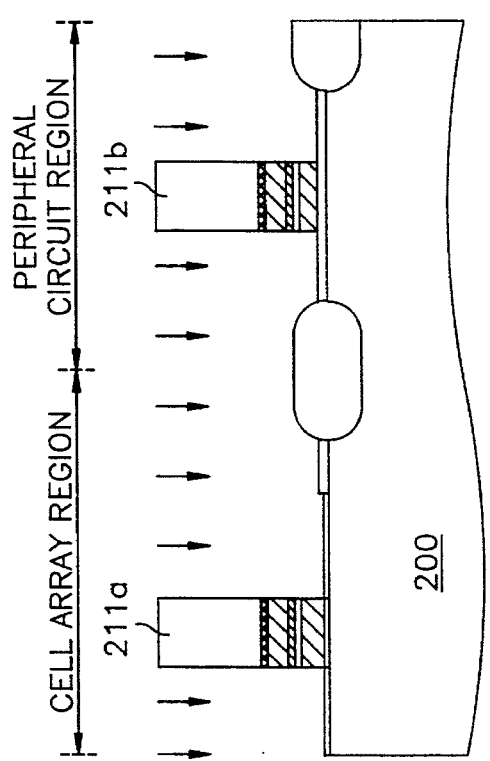

Referring to FIGS. 3G and 3H, photoresist patterns 211a and 211b are formed in the cell array region and the peripheral circuit region, and the silicide layer 209, third polycrystalline silicon layer 208, second polycrystalline silicon layer 206, interlayer insulating film 205 and first polycrystalline silicon layer 204 are etched by photolithography to form the gate electrodes of the storage cell transistor and of the transistor in the peripheral circuit region. After this, an ion-implantation is performed (as indicated in FIG. 3G) to form source and drain regions. While performing the steps illustrated with reference to FIG. 3E, a wet-etch step may be added to eliminate a naturally occurring oxide on the surface of the second polycrystalline silicon layer 206 which may form prior to depositing the third polycrystalline silicon layer 208.

As shown in FIG. 3F, it can be noted that the first polycrystalline silicon layer 204 and the third polycrystalline silicon layer 208 are in electrical contact with each other via the contact hole 210 of the peripheral circuit region. Accordingly, the first and third polycrystalline silicon layers 204 and 208 serve as a single gate electrode in the peripheral circuit region.

In FIGS. 3G and 3H, since the gate electrodes of the storage cell transistor and of the transistor in the peripheral circuit region are completed through a single photolithography process, the number of processing steps is decreased as compared with that of the conventional technique.

Figures 3I, 3J:
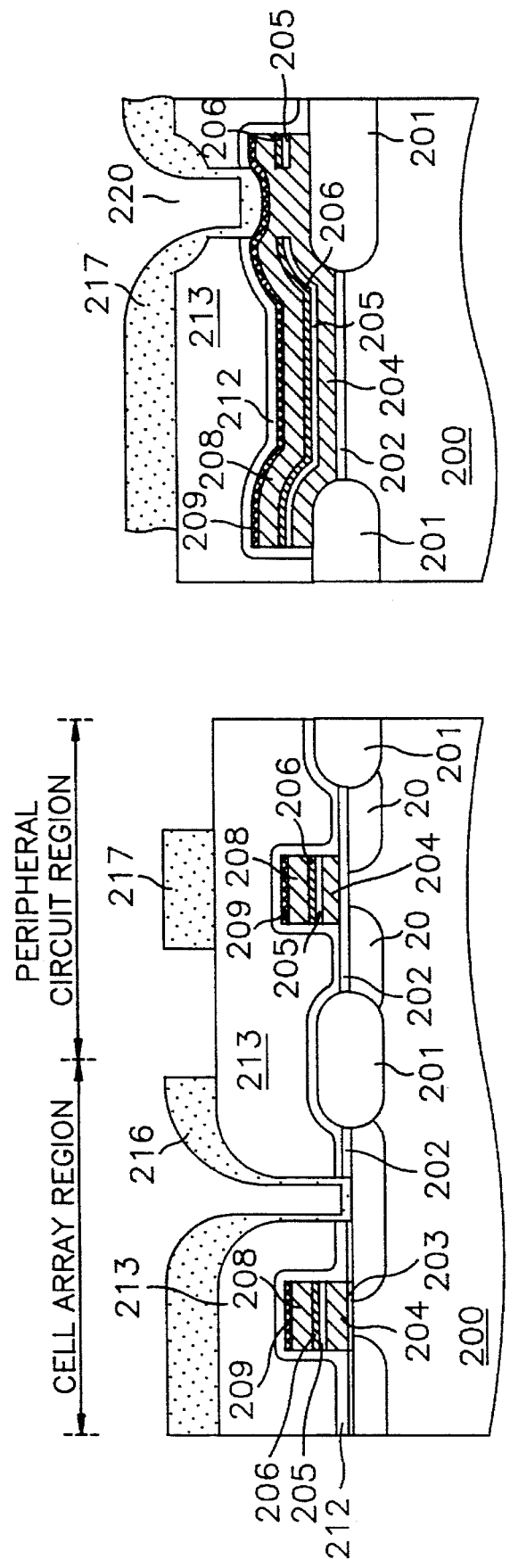

As shown in FIGS. 3I and 3J, after removing the photoresist patterns 211a and 211b, a drive-in process is executed to form source and drain regions of the transistor in the peripheral circuit region and those of the storage cell transistor in the cell array region. A LTO insulating layer 212 and a BPSG layer 213 are sequentially formed on the surface of the structure and a reflow process is performed. Finally, metal layers 216 and 217 are formed after forming contact holes in the cell array region and the peripheral circuit region. The metal layer 217 in the peripheral circuit region is preferably disposed in a contact hole 220 adjacent contact hole 210. As shown in FIG. 3J, since the lower gate electrode (the first polycrystalline silicon layer 204) and the upper gate electrode (the third polycrystalline silicon layer 208) of the peripheral circuit region transistor are electrically connected to each other, they operate as a single gate electrode.

In the memory device having the multi-level gate structure according to the present invention as described above, the storage cell transistor in the cell array region and the transistor in the peripheral circuit region have the same multi-level gate structure. Also, multi-level polycrystalline silicon layers in the peripheral circuit region are electrically connected to each other, and are thus utilized as an electrically singular gate electrode. The gate structures of the two regions are formed through a single photolithographic etching process so that the overall manufacturing process is advantageously simplified. Manufacturing damage to the field oxide layer is also advantageously reduced to thereby enhance insulating performance. Furthermore, since the photolithography process is carried out after depositing a polycrystalline silicon on the surface of the interlayer insulating film, the interlayer insulating film is protected from contamination from the photolithography process, thereby providing a non-volatile memory device having an interlayer insulating film with excellent insulating performance.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a semiconductor transistor gate structure comprising the steps of:

(a) forming a gate oxide layer on a substrate;

(b) removing a portion of said gate oxide layer from a cell region to thereby expose the substrate;

(c) forming a tunnel oxide layer on the exposed portion of the substrate;

(d) forming a first polycrystalline silicon layer on the resultant structure after said step of forming a tunnel oxide layer;

(e) forming an interlayer insulating film on the first polysilicon crystalline layer;

(f) forming a second polycrystalline silicon layer on the interlayer insulating film;

(g) partially etching the second polycrystalline silicon layer and the interlayer insulating film to form a contact hole therethrough, thereby exposing a portion of said first polycrystalline silicon layer; and (h) filling the contact hole with a third polycrystalline layer so that the first and third polycrystalline silicon layers are in electrical contact.

2. A method for manufacturing a semiconductor gate transistor according to claim 1, further comprising the steps of:

(a) forming a silicide layer on the third polysilicon crystalline layer; and (b) etching the silicide layer, the third polycrystalline silicon layer, the second polycrystalline silicon layer, the interlayer insulating film, and the first polycrystalline silicon layer with a photolithography process to form a semiconductor gate structure.

3. A method for manufacturing a semiconductor transistor gate structure according to claim 2, wherein said step of etching the silicide layer, the third polycrystalline silicon layer the second polycrystalline silicon layer, the interlayer insulating film, and the first polycrystalline silicon layer is performed by forming a photoresist pattern on the silicide layer and etching the silicide layer, the third polycrystalline silicon layer, the second polycrystalline silicon layer, the interlayer insulating film, and the first polycrystalline silicon layer using the photoresist pattern as a mask.

4. A method for manufacturing a semiconductor transistor according to claim 1, wherein the interlayer insulating film is a multi-level insulating layer obtained by successively forming an oxide layer, a nitride layer, and an oxide layer.

5. A method for manufacturing a semiconductor transistor according to claim 1, further comprising an etching step of removing a naturally occurring oxide layer from the surface of the second polycrystalline silicon layer before forming the third polycrystalline silicon layer thereon.

6. A method for manufacturing a semiconductor memory device as claimed in claim 2, wherein a metal layer is deposited such that it contacts the silicide layer adjacent the contact hole through which the third and first polycrystalline silicon layers are in electrical contact with one another.

7. A method for manufacturing a semiconductor memory device as claimed in claim 2, wherein the silicide layer is formed of tungsten silicide.

* * * * *